United States Patent
Jung et al.

(10) Patent No.: US 10,447,283 B1
(45) Date of Patent: Oct. 15, 2019

(54) BROADBAND PHASE LOCKED LOOP FOR MULTI-BAND MILLIMETER-WAVE 5G COMMUNICATION

(71) Applicant: SPEEDLINK TECHNOLOGY INC., Cupertino, CA (US)

(72) Inventors: Doohwan Jung, Atlanta, GA (US); Thomas Chen, Vancouver (CA); Hua Wang, Atlanta, GA (US)

(73) Assignees: SPEEDLINK TECHNOLOGY INC., Cupertino, CA (US); GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 15/992,066

(22) Filed: May 29, 2018

(51) Int. Cl.
*H03D 3/24* (2006.01)
*H03L 7/099* (2006.01)
*H03L 7/08* (2006.01)
*H03L 7/087* (2006.01)
*H03L 7/093* (2006.01)
*H01Q 5/50* (2015.01)

(52) U.S. Cl.
CPC .......... *H03L 7/0992* (2013.01); *H03L 7/0805* (2013.01); *H03L 7/087* (2013.01); *H03L 7/093* (2013.01); *H01Q 5/50* (2015.01)

(58) Field of Classification Search
CPC ................... H04L 7/033; H04L 7/0331; H04L 2027/0016; H03L 7/0891; H03L 7/093; H03L 2207/06; H03L 7/18; H03L 7/08; H03D 3/0925

USPC ................ 375/376, 294, 327, 375; 327/156; 331/177 R; 455/103, 127, 307
See application file for complete search history.

(56) References Cited

U.S. PATENT DOCUMENTS

| | | | |
|---|---|---|---|
| 2006/0181318 A1* | 8/2006 | Burgess | H03L 7/0891 327/156 |
| 2008/0122977 A1* | 5/2008 | Miyamoto | H03L 7/087 348/537 |
| 2011/0215846 A1* | 9/2011 | Furuta | H03L 7/08 327/148 |
| 2014/0179251 A1* | 6/2014 | Persico | H03G 3/3078 455/226.2 |
| 2016/0164558 A1* | 6/2016 | Elzeftawi | H03B 19/12 455/192.1 |
| 2017/0310458 A1* | 10/2017 | Zanuso | H03L 7/087 |

* cited by examiner

*Primary Examiner* — Khai Tran
(74) *Attorney, Agent, or Firm* — Womble Bond Dickinson (US) LLP

(57) ABSTRACT

According to one embodiment, a phase locked loop (PLL) circuit includes a first voltage controlled oscillator (VCO) to generate a first signal having a first frequency and a second VCO to generate a second signal having a second frequency. The PLL circuit includes a multiplexer coupled to the first VCO, the second VCO, and a feedback loop. The PLL circuit includes a control logic to select either the first VCO or the second VCO using the multiplexer to feed back a signal using the feedback loop, and a phase frequency detector coupled to the first VCO, the second VCO, and the feedback loop, where the phase frequency detector is configured to receive a reference signal and the feedback signal to tracking a frequency and a phase of the first or the second generated signal using the reference signal and the feedback signal.

18 Claims, 15 Drawing Sheets

BROADBAND PHASE LOCKED LOOP FOR MULTI-BAND MILLIMETER-WAVE 5G COMMUNICATION

FIELD OF THE INVENTION

Embodiments of the present invention relate generally to wireless communication devices. More particularly, embodiments of the invention relate to a broadband phase locked loop (PLL) of a communication device.

BACKGROUND 5G communication operates in a multi-band frequency range from approximately 18.5 GHz to 41.5 GHz. A multi-band frequency operation requires a PLL which can operate in two or more frequency bands (e.g., 18.5 GHz to 26.5 GHz, 31.5 GHz to 41.5 GHz, etc.) in the wireless transceiver communication devices. Conventional 5G communication PLLs may directly assemble several narrow-band PLLs on a single integrated circuit (IC) chip or on a multi-chip module (MCM) to operate at multiple frequency bands. However, this approach suffers from a high cost due to excessive chip/module area.

An alternative approach is to use higher order harmonic frequencies (e.g., second, third, fourth harmonic frequencies) as the output signals. This approach, although reduces the number of PLLs in the wide-bandwidth 5G communication systems, however, require additional filters and amplifiers to select the higher order harmonics and to amplify the higher order harmonic signals to provide a desirable power output to drive subsequent stages of the circuit. Furthermore, higher order harmonic signals have frequencies limited to some multiples of the first harmonic frequency.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
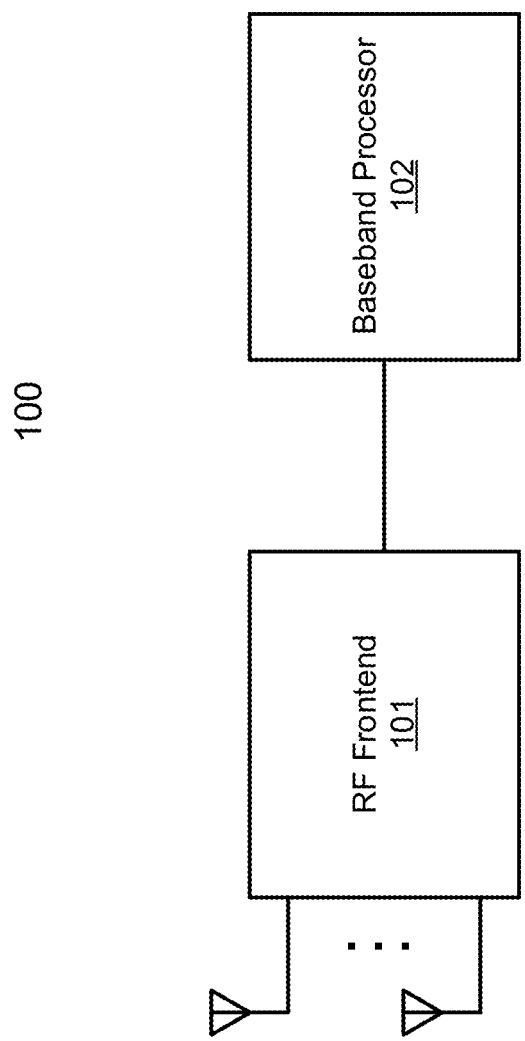
FIG. 1 is a block diagram illustrating an example of a wireless communication device according one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, unless otherwise specified, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, etc., may be used without departing from the scope of the disclosure.

In some embodiments, a PLL circuit can include one or more (e.g., dual) VCOs. The one or more VCOs can share a phase frequency detector (PFD), a charge pump (ICP) and a third order LPF. Each of the one or more VCOs can generate a separate LO signal (e.g., at one or more LO frequencies) for a multi-band transceiver for 5G communication. The multiple VCO-based PLL occupies a small area and can provide adequate power to subsequent circuit stages without additional filters and/or amplifiers.

According to a first aspect, a phase locked loop (PLL) circuit includes a first voltage controlled oscillator (VCO) to generate a first signal having a first frequency in a first frequency band and a second VCO to generate a second signal having a second frequency in a second frequency band, where the second frequency band is a different frequency band than the first frequency band. The PLL circuit includes a multiplexer coupled to the first VCO, the second VCO, and a feedback loop. The PLL circuit includes a control logic to select either the first VCO or the second VCO using the multiplexer to feed back a signal associated with the first VCO or the second VCO using the feedback loop, and a phase frequency detector coupled to the first VCO, the second VCO, and the feedback loop, where the phase frequency detector is configured to receive a reference signal and the feedback signal to track a frequency and/or a phase of the first or the second generated signal using the reference signal and the feedback signal.

In one embodiment, the PLL circuit generates a first LO having the first frequency or a second LO having the second frequency, where the first frequency and the second frequency are both first harmonics. Note, a first harmonic (or fundamental/natural frequency/harmonic) is the lowest frequency produced by a periodic waveform or oscillation of an object, in contrast from higher harmonics at higher frequencies. In one embodiment, the first frequency range is approximately 18.5 GHz to 26.5 GHz and the second frequency range is approximately 31.5 GHz to 41.5 GHz.

In one embodiment, the PLL circuit further includes a first current model logic (CML) frequency divider circuit coupled in between the first VCO and the multiplexer and a second CML frequency divider circuit coupled in between the second VCO and the multiplexer. In another embodiment, the first or the second CML frequency divider circuit is a 1/16 frequency divider. In another embodiment, the PLL circuit further includes a first digital frequency divider circuit coupled in between the first CML and the multiplexer and a second digital frequency divider circuit coupled in between the second CML and the multiplexer. In one embodiment, the first or the second digital frequency divider circuit is selectable from 1/16 to 1/63 frequency divisions.

In one embodiment, the PLL circuit further includes a low pass filter coupled in between the phase frequency detector and the first and the second VCOs, where the low pass filter is a third order low pass filter. In another embodiment, the third order low pass filter includes a passive resistor-capacitor network having three separate resonant frequencies. In another embodiment, the control logic further disables one of the first VCO or the second VCO that is not selected.

According to a second aspect, a radio frequency (RF) frontend circuit includes a phase locked loop circuit to generate a LO signal, the phase locked loop circuit includes: a first voltage controlled oscillator (VCO) to generate a first signal having a first frequency in a first frequency band and a second VCO to generate a second signal having a second frequency in a second frequency band, where the second frequency band is a different frequency band than the first frequency band. The PLL circuit includes a multiplexer coupled to the first VCO, the second VCO, and a feedback loop. The PLL circuit includes a control logic to select either the first VCO or the second VCO using the multiplexer to feed back a signal associated with the first VCO or the second VCO using the feedback loop, and a phase frequency detector coupled to the first VCO, the second VCO, and the feedback loop, where the phase frequency detector is configured to receive a reference signal and the feedback signal to track a frequency and/or a phase of the first or the second generated signal using the reference signal and the feedback signal.

According to a third aspect, a dual voltage controlled oscillator (VCO) circuit includes a first VCO circuit to generate a first signal having a first frequency in a first frequency band, the first VCO circuit includes: a first variable capacitor having an input node, a first output node, and a second output node, a second variable capacitor coupled in parallel with the first variable capacitor, a first transistor having a first drain terminal, a first gate terminal, and a first source terminal, where the first drain terminal is coupled to the first output node, the first gate terminal is coupled to the second output node, and the first source terminal is coupled to a ground node, and a second transistor having a second drain terminal, a second gate terminal, and a second source terminal, where the second drain terminal is coupled to the second output node and the second gate terminal is coupled to the first output node, and the second source terminal is coupled to the ground node. The dual VCO circuit includes a second VCO circuit to generate a second signal having a second frequency in a second frequency band, the second VCO circuit includes a third variable capacitor having a third output node and a fourth output node, a fourth variable capacitor coupled in parallel with the third variable capacitor, a third transistor having a third drain terminal, a third gate terminal, and a third source terminal, where the third drain terminal is coupled to the third output node, the third gate terminal is coupled to the fourth output node, and the third source terminal is coupled to the ground node, and a fourth transistor having a fourth drain terminal, a fourth gate terminal, and a fourth source terminal, where the fourth drain terminal is coupled to the fourth output node, the fourth gate terminal is coupled to the third output node, and the fourth source terminal is coupled to the ground node. The dual VCO circuit includes a first inductor coupled in between the first output node and the second output node to resonate with the first and the second variable capacitors at the first frequency and a second inductor coupled in between the third output node and the fourth output node to resonate with the third and the fourth variable capacitors at the second frequency.

In one embodiment, the first inductor and the second inductor are both loop inductors and the first inductor overlaps an area of the second inductor such that the first inductor and the second inductor together has a single inductor footprint. In one embodiment, the first frequency range is approximately 18.5 GHz to 26.5 GHz and the second frequency range is approximately 31.5 GHz to 41.5 GHz.

In one embodiment, the dual VCO circuit further includes a first buffer output network circuit coupled in between the first output node and the second output node, and a second buffer output network circuit coupled in between the third output node and fourth second output node. In another embodiment, the first buffer output network and the second buffer output network are second order output networks. In another embodiment, the first buffer output network and the second buffer output network includes a first transformer and a second transformer respectively.

In another embodiment, the first transformer has a leakage inductance and a magnetic inductance together with a parasitic capacitance seen by the first transformer and a capacitance of a secondary winding of the first transformer resonate at a third frequency and a fourth frequency. In another embodiment, the second transformer has a leakage inductance and a magnetic inductance together with a parasitic capacitance seen by the second transformer and a capacitance of a secondary winding of the second transformer resonate at a fifth frequency and a sixth frequency.

In one embodiment, wherein the first transformer and the second transformer each have a transformer ratio of approximately 1 to 1.5. In another embodiment, the first, second, third, and fourth transistors include transistors with a larger gate length than other transistors of a phase locked loop circuit comprising the dual VCO circuit. In another embodiment, the first VCO is enable and the second VCO is disable or the first VCO is disable and the second VCO is enable.

According to a fourth aspect, a PLL circuit includes a dual voltage controlled oscillator (VCO) circuit to generate two separate signals both at natural/fundamental or first harmonic frequencies. The dual voltage controlled oscillator (VCO) circuit includes a first VCO circuit to generate a first signal at a first frequency and a second VCO circuit to generate a second signal at a second frequency. The first VCO circuit includes a first variable capacitor having a first output node and a second output node, a second variable capacitor coupled in parallel with the first variable capacitor, a first transistor having a first drain terminal, a first gate terminal, and a first source terminal, where the first drain terminal is coupled to the first output node, the first gate terminal is coupled to the second output node, and the first source terminal is coupled to a ground node, and a second transistor having a second drain terminal, a second gate terminal, and a second source terminal, where the second drain terminal is coupled to the second output node and the second gate terminal is coupled to the first output node, and the second source terminal is coupled to the ground node. The second VCO circuit includes a third variable capacitor having a third output node and a fourth output node, a fourth variable capacitor coupled in parallel with the third variable capacitor, a third transistor having a third drain terminal, a third gate terminal, and a third source terminal, where the third drain terminal is coupled to the third output node, the third gate terminal is coupled to the fourth output node, and the third source terminal is coupled to the ground node, and a fourth transistor having a fourth drain terminal, a fourth gate terminal, and a fourth source terminal, where the fourth drain terminal is coupled to the fourth output node, the fourth gate terminal is coupled to the third output node, and the fourth source terminal is coupled to the ground node. The PLL circuit includes a first inductor coupled in between the first output node and the second output node to resonate with the first and the second variable capacitors at the first frequency, and a second inductor coupled in between the third output node and the fourth output node to resonate with the third and the fourth variable capacitors at the second frequency. The PLL circuit includes a multiplexer coupled to the first VCO circuit, the second VCO circuit, and a feedback loop, and a control logic to select either the first VCO circuit or the second VCO circuit using the multiplexer to feed back a signal associated with the first VCO circuit or the second VCO circuit using the feedback loop. The PLL circuit includes a phase frequency detector coupled to the first VCO circuit and the second VCO circuit and the feedback loop, wherein the phase frequency detector is configured to receive a reference signal and the feedback signal to track a frequency and/or a phase of the first or the second generated signal using the reference signal and the feedback signal.

According to a fifth aspect, an RF frontend circuit includes a PLL circuit to generate a local oscillator (LO) signal. The PLL circuit includes a dual voltage controlled oscillator (VCO) circuit to generate two separate signals both at natural/fundamental or first harmonic frequencies. The dual voltage controlled oscillator (VCO) circuit includes a first VCO circuit to generate a first signal at a first frequency and a second VCO circuit to generate a second signal at a second frequency. The first VCO circuit includes a first variable capacitor having a first output node and a second output node, a second variable capacitor coupled in parallel with the first variable capacitor, a first transistor having a first drain terminal, a first gate terminal, and a first source terminal, where the first drain terminal is coupled to the first output node, the first gate terminal is coupled to the second output node, and the first source terminal is coupled to a ground node, and a second transistor having a second drain terminal, a second gate terminal, and a second source terminal, where the second drain terminal is coupled to the second output node and the second gate terminal is coupled to the first output node, and the second source terminal is coupled to the ground node. The second VCO circuit includes a third variable capacitor having a third output node and a fourth output node, a fourth variable capacitor coupled in parallel with the third variable capacitor, a third transistor having a third drain terminal, a third gate terminal, and a third source terminal, where the third drain terminal is coupled to the third output node, the third gate terminal is coupled to the fourth output node, and the third source terminal is coupled to the ground node, and a fourth transistor having a fourth drain terminal, a fourth gate terminal, and a fourth source terminal, where the fourth drain terminal is coupled to the fourth output node, the fourth gate terminal is coupled to the third output node, and the fourth source terminal is coupled to the ground node. The PLL circuit includes a first inductor coupled in between the first output node and the second output node to resonate with the first and the second variable capacitors at the first frequency, and a second inductor coupled in between the third output node and the fourth output node to resonate with the third and the fourth variable capacitors at the second frequency. The PLL circuit includes a multiplexer coupled to the first VCO circuit, the second VCO circuit, and a feedback loop, and a control logic to select either the first VCO circuit or the second VCO circuit using the multiplexer to feed back a signal associated with the first VCO circuit or the second VCO circuit using the feedback loop. The PLL circuit includes a phase frequency detector coupled to the first VCO circuit and the second VCO circuit and the feedback loop, wherein the phase frequency detector is configured to receive a reference signal and the feedback signal to track a frequency and/or phase of the first or the second generated signal using the reference signal and the feedback signal.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or TOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower intermediate frequency (IF). In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes a frequency synthesizer coupled to the RF transceivers. The frequency synthesizer generates and provides a local oscillator (LO) signal to each of the RF transceivers to enable the RF transceiver to mix, modulate, and/or demodulate RF signals within a corresponding frequency band. The RF transceivers and the frequency synthesizer may be integrated within a single IC chip as a single RF frontend IC chip or package.

Figure 2:
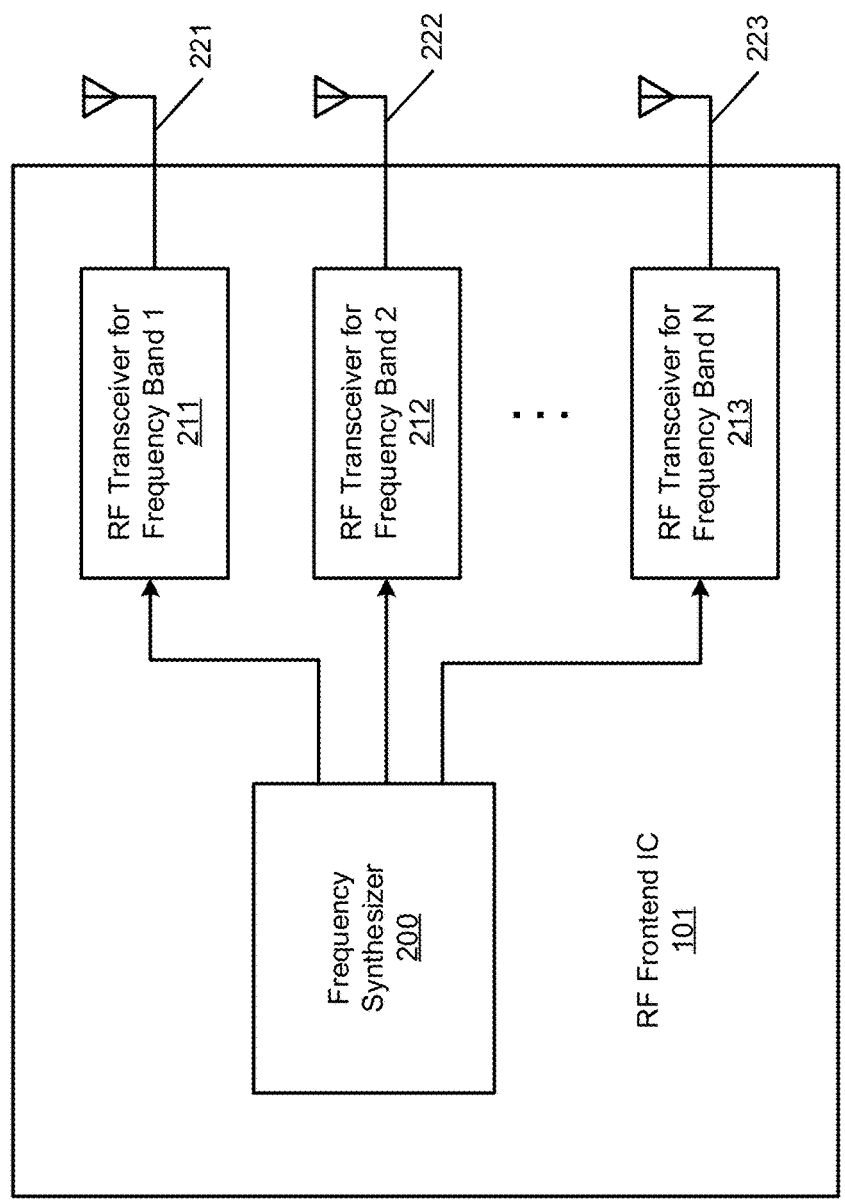
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, a frequency synthesizer 200 coupled to a multi-band RF transceiver 211. Transceiver 211 is configured to transmit and receive RF signals within one or more frequency bands or a broad range of RF frequencies via RF antenna 221. In one embodiment, transceiver 211 is configured to receive one or more LO signals from frequency synthesizer 200. The LO signals are generated for the one or more corresponding frequency bands. The LO signals are utilized to mix, modulate, demodulated by the transceiver for the purpose of transmitting and receiving RF signals within corresponding frequency bands.

Figure 3:
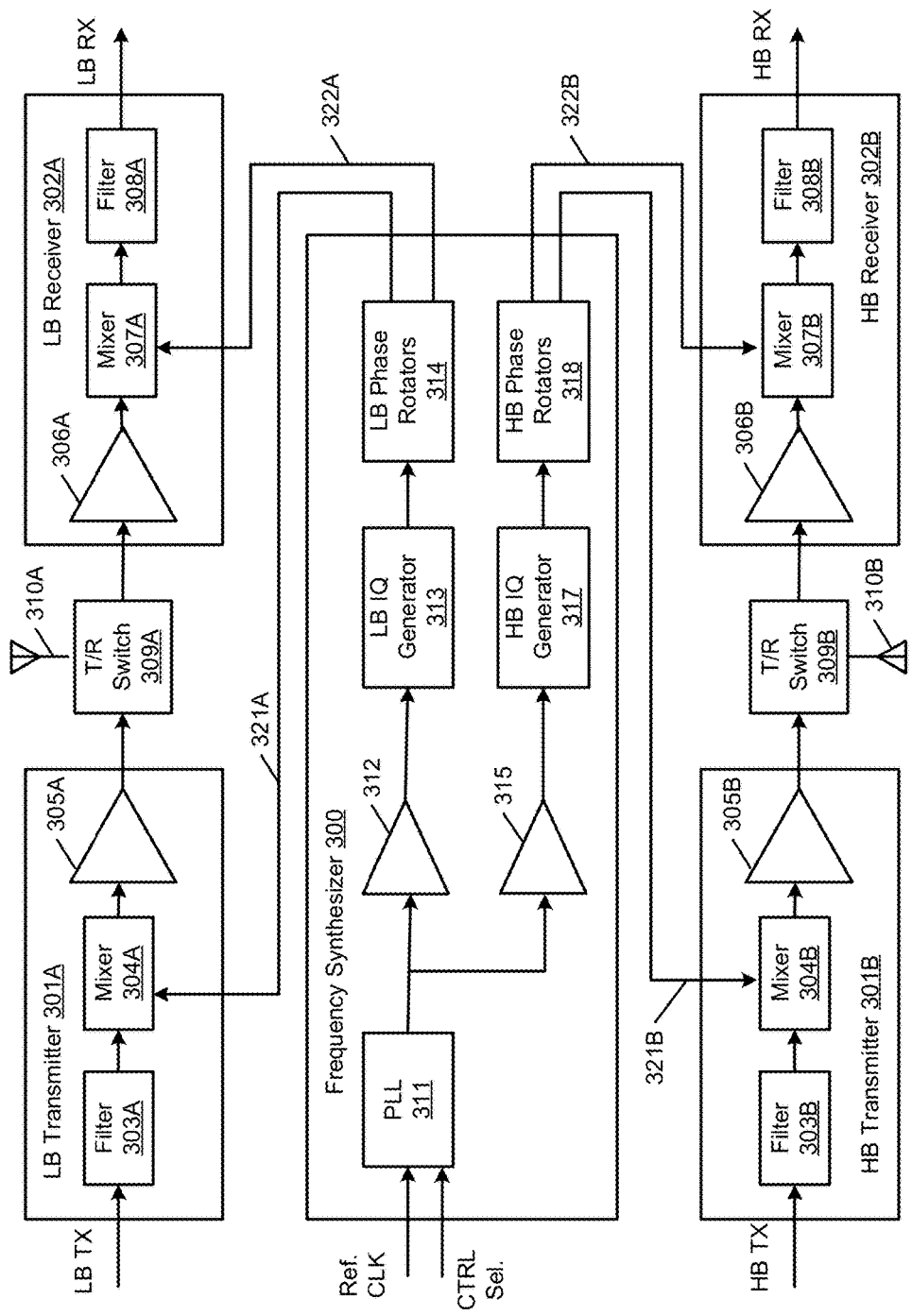
FIG. 3 is a block diagram illustrating an RF frontend integrated circuit according to one embodiment.

FIG. 3 is a block diagram illustrating an RF frontend integrated circuit according to another embodiment of the invention. Referring to FIG. 3, frequency synthesizer 300 may represent frequency synthesizer 200 as described above. In one embodiment, frequency synthesizer 300 is communicatively coupled to an array of transceivers, each transceiver corresponding to one of a number of frequency bands. In this example, frequency synthesizer 300 is coupled to transmitter 301A, receiver 302A, transmitter 301B, and receiver 302B. Transmitter 301A and receiver 302A may be a part of a first transceiver operating in a lower frequency band, referred to as a low-band (LB) transmitter and LB receiver. Transmitter 301B and receiver 302B may be a part of a second transceiver operating in a higher frequency band, referred to as a high-band (HB) transmitter and HB receiver. For example, the LB can be approximately 18.5 GHz to 26.5 GHz while the HB can be approximately 31.5 GHz to 41.5 GHz). Note that although there are only two transceivers as shown in FIG. 3, more or fewer transceivers may also be coupled to the frequency synthesizer as shown in FIG. 2.

In one embodiment, frequency synthesizer 300 includes, but is not limited to, phase-lock loop (PLL) circuitry or block 311, a LO buffer 312, LB in-phase/quadrature (IQ) generator 313, and LB phase rotators 314. A PLL is a control system that generates an output signal whose phase is related to the phase of an input signal. A PLL includes a variable frequency oscillator and a phase detector. The oscillator generates a periodic signal, and the phase detector compares the phase of that signal with the phase of the input periodic signal, adjusting the oscillator to keep the phases matched. Bringing the output signal back toward the input signal for comparison is called a feedback loop since the output is "fed back" toward the input forming a loop.

Keeping the input and output phase in lock step also implies keeping the input and output frequencies the same. Consequently, in addition to synchronizing signals, a phase-locked loop can track an input frequency, or it can generate a frequency that is a multiple of the input frequency. These properties are used for clock synchronization, demodulation, and frequency synthesis. Phase-locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors.

Referring back to FIG. 3, in one embodiment, PLL block 311 is to receive a clock reference signal and a control select signal. The PLL block 311 is to lock onto the frequency of the clock reference signal to generate a first LO signal or a second LO signal based on the control select signal. For example, if the control select signal is de-asserted, PLL block 311 can generate a first LO signal, i.e., a low-band LO signal or LBLO signal. The first LO signal may be optionally buffered by a LO buffer 312. Based on the LBLO signal, LB IQ generator 313 generates IQ LO signals that are suitable for mixing, modulating, and demodulating in-phase and quadrature components of RF signals. The IQ signals may be rotated by a predetermined angle or delayed by LB phase rotators 314. The rotated IQ signals are then provided to LB transmitter 301A and receiver 302A. Particularly, the IQ signals may include transmitting IQ (TXIQ) signals 321A to be provided to LB transmitter 301A and in-phase and quadrature receiving IQ (RXIQ) signals 322A to be provided to LB receiver 302A.

In another embodiment, if the control select is asserted, PLL block 311 is to lock onto the frequency of the clock reference signal to generate a second LO signal, i.e., a high-band LO signal or HBLO signal. The second LO signal may be optionally buffered by LO buffer 315. Based on the HBLO signal, HB IQ generator 317 generates IQ LO signals that are suitable for mixing, modulating, and demodulating in-phase and quadrature components of RF signals. The IQ signals may be rotated by a predetermined angle or delayed by HB phase rotators 318. The rotated IQ signals are then provided to HB transmitter 301B and receiver 302B. Particularly, the IQ signals may include FQ signals 321B to be provided to HB transmitter 301B and FQ signals 322B to be provided to HB receiver 302B. Note, if there are more transmitters and receivers of more frequency bands involved, more sets of components 312-314 and/or components 315-318 may be maintained by frequency synthesizer 300 for generating the necessary TXIQ and RXIQ signals for the additional frequency bands. The control select for the PLL can then enable the corresponding VCO for the desired output LO signal.

In one embodiment, LB transmitter 301A includes a filter 303A, a mixer 304A, and an amplifier 305A. Filter 303A may be a low-pass (LP) filter that receives LB transmitting (LBTX) signals to be transmitted to a destination, where the LBTX signals may be provided from a baseband processor such as baseband processor 102. Mixer 301A (also referred to as an up-convert mixer or an LB up-convert mixer)) is configured to mix and modulate the LBTX signals onto a carrier frequency signal based on TXIQ signal provided by LB phase rotators 314. The modulated signals (e.g., low-band RF or LBRF signals) are then amplified by amplifier 305A and the amplified signals are then transmitted to a remote receiver via antenna 310A.

In one embodiment, LB receiver 302A includes an amplifier 306A, mixer 307A, and filter 308A. Amplifier 306A is to receive LBRF signals from a remote transmitter via antenna 310A and to amplify the received RF signals. The amplified RF signals are then demodulated by mixer 307A (also referred to as a down-convert mixer or an LB down-convert mixer) based on an IQ LO signal received from LB phase rotators 314. The demodulated signals are then processed by filter 308A, which may be a low-pass filter. In one embodiment, LB transmitter 301A and LB receiver 302A share antenna 310A via a transmitting and receiving (T/R) switch 309A. T/R switch 309A is configured to switch between LB transmitter 301A and receiver 302A to couple antenna 310A to either LB transmitter 301A or LB receiver 302A at a particular point in time.

Similarly, HB transmitter 301B includes filter 303B, mixer 304B (also referred to as a HB up-convert mixer), and amplifier 305B having functionalities similar to filter 303A, mixer 304A, and amplifier 305A of LB transmitter 301A, respectively, for processing high-band transmitting (HBTX) signals. HB receiver 302B includes filter 306B, mixer 307B (also referred to as a HB down-convert mixer), and filter 308B having functionalities similar to amplifier 306A, mixer 307A, and filter 308A of LB receiver 302A, respectively, for processing high-band receiving (HBRX) signals. HB transmitter 301B and HB receiver 302B are coupled to antenna 310B via T/R switch 309B similar to the configuration of LB transmitter 301A and receiver 302A.

Figure 4:
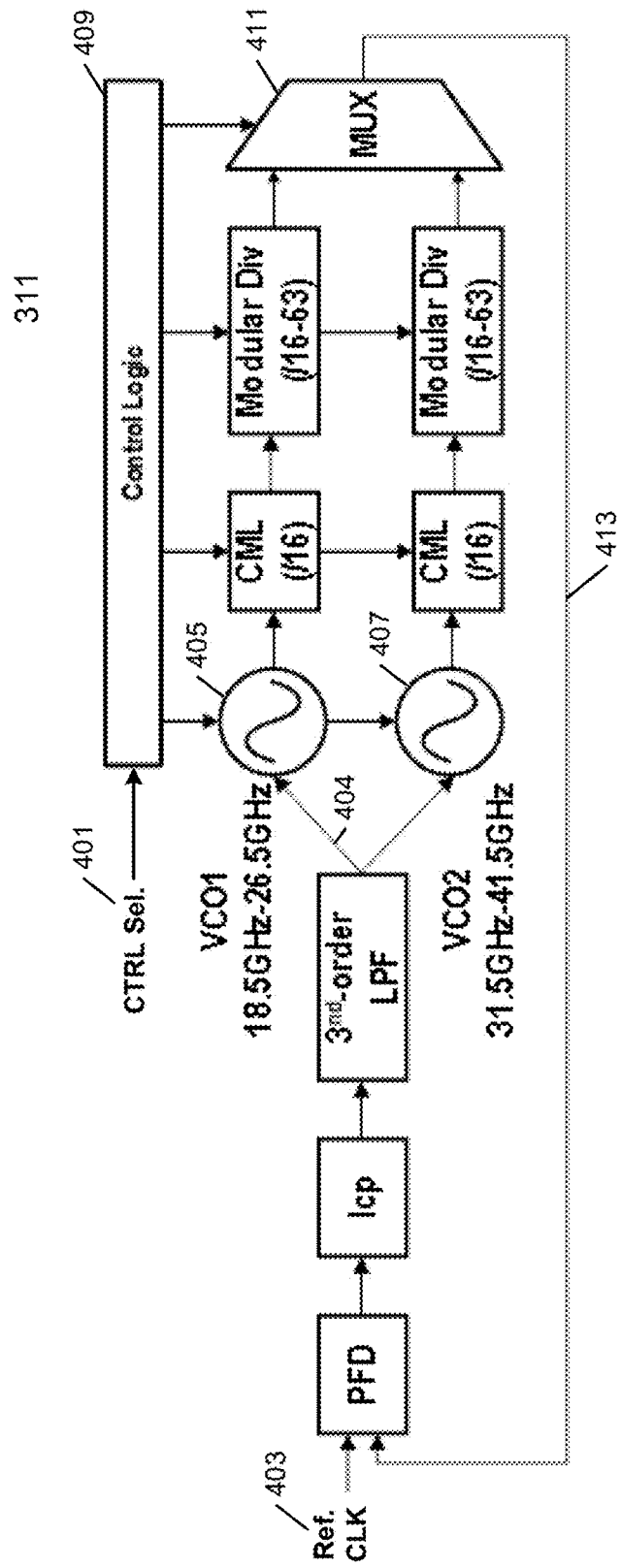
FIG. 4 is a block diagram illustrating an example of a phase locked loop circuit according to one embodiment.

FIG. 4 is a block diagram illustrating an example of a phase locked loop circuit according to one embodiment. Referring to FIG. 4, in one embodiment, PLL circuit 311 includes a phase detector chain, which includes a phase detector (PFD), a charge pump (Icp), and a loop filter (LPF) in that order. The Loop filter is coupled to two separate VCO chains (e.g., a first VCO chain and a second VCO chain). The first and the second VCO chains are coupled to multiplexer 411 which is then coupled to feedback loop 413. In one embodiment, the first and the second VCO chains include a first VCO 405 (e.g., VCO1) and a second VCO 407 (e.g., VCO2) respectively. VCO1 and VCO2 are each coupled to a current mode logic (CML) (e.g., an analog frequency divider) and a modular divider (e.g., a digital frequency divider) for the corresponding first and second VCO chains. The modular dividers of the first and the second VCO chains are coupled to input ports of multiplexer 411 for multiplexer 411 to select one of the VCO chains. In one embodiment, the PFD is coupled to VCO1 and VCO2 (e.g., via multiplexer 411), and feedback loop 413. In one embodiment, PLL circuit 311 further includes control logic 409 to selectively enable either the first VCO or the second VCO. E.g., control logic 409 can also disable (or power off) either the first VCO or the second VCO. In one embodiment, control logic 409 is coupled to multiplexer 411 to provide a select signal for multiplexer 411 to select an input from either the first or the second VCOs but not both. The selected VCO then completes the feedback path (via feedback loop 413) back to the PFD.

For example, in one embodiment, the PFD receives a reference clock signal 403 and control logic 409 receives a control select signal 401. Control select signal 401 selectively enables either VCO1 405 or VCO2 407 and selects an output signal from the enabled VCO via multiplexer 411 to feed back the output signal to the PFD via feedback loop 413. The PFD can then track and/or correct for a frequency and/or a phase of the fed back signal for the corresponding VCO (e.g., generated output signal for VCO1 or VCP2) using reference clock signal 403 and the feedback signal.

Referring to the VCO chains, the CML and modular dividers can perform frequency divisions. In one embodiment, the CML frequency divides the VCO output signal by a factor of 16 in an analog domain. In another embodiment, the modular divider frequency selectively divides the output signal from the CML by a factor of 16 to 63 in a digital domain for a combined factor of 256 to 1008 for the CML and the modular dividers. In one embodiment, the output signals of VCO1 405 and VCO2 407 each has a different frequency, which can be a different frequency from the reference clock signal. In another embodiment, the output signals of VCO1 405 and VCO2 407 are first harmonics or natural harmonics/frequencies of VCO1 and VCO2 respectively. In another embodiment, VCO1 and VCO2 have identical structures (e.g., capacitances) but VCO1 is tuned to resonate at a first frequency using a first inductor and VCO2 is tuned to resonate at a second frequency using a second inductor. In one embodiment, the first frequency is in the first frequency range of approximately 18.5 GHz to 26.5 GHz and the second frequency is in the second frequency range of approximately 31.5 GHz to 41.5 GHz.

In one embodiment, the loop filter or third order low pass filter (LPF) includes a passive resistor-capacitor (RC) network having three separate resonant frequencies. In another embodiment, the passive RC network includes a π-shaped RC network. Table 1 provides an example embodiment of a dual-band PLL circuit having a third order LPF at three separate (e.g., R1-C1, R2-C2, R3-C3) resonant frequencies. Note, the phase margin of the dual-band PLL circuit can be tuned to approximately 63.9 degrees and approximately 62.3 degrees for the respective bands of Table 1.

TABLE 1

| Frequency (GHz) | Loop BW (kHz) | Fref (MHz) | Fout (GHz) | $K_{VCO}$ (MHz/V) | $I_{CP}$ (mA) | C1 (pF) | R2 (kΩ) | C2 (pF) | R3 (kΩ) | C3 (fF) | PM (°) |
|---|---|---|---|---|---|---|---|---|---|---|---|
| 18.5–26.5 | 1048 | 50 | 22 | 1000 | 0.08 | 0.97 | 36.72 | 24.48 | 110 | 80 | 63.9 |
| 31.5–41.5 | 1260 | 50 | 36 | 2000 | 0.08 | | | | | | 62.3 |

Figure 5:
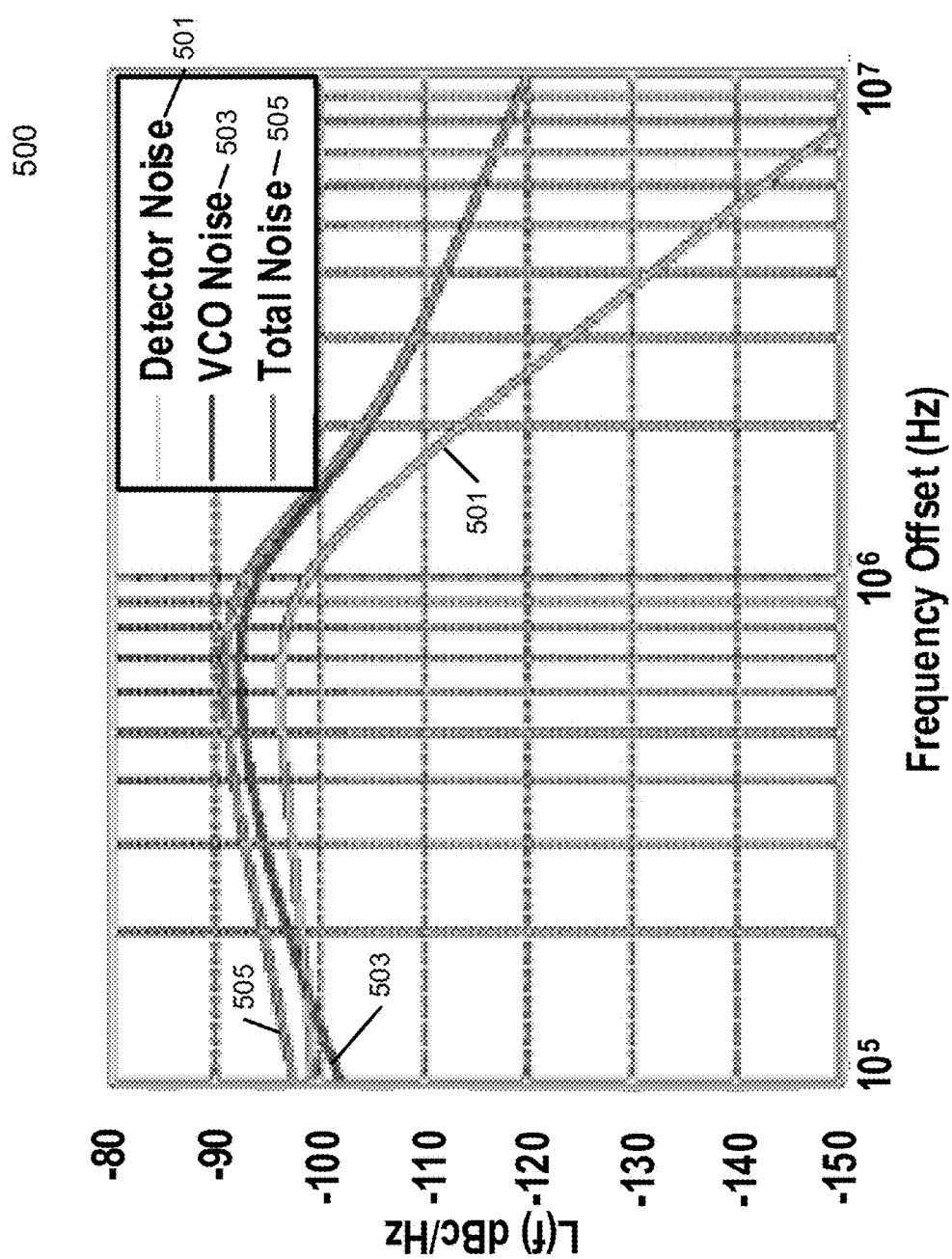
FIG. 5 is a block diagram illustrating an example simulation for phase noise of a dual-band PLL circuit at 22 GHz according to one embodiment.
Figure 6:
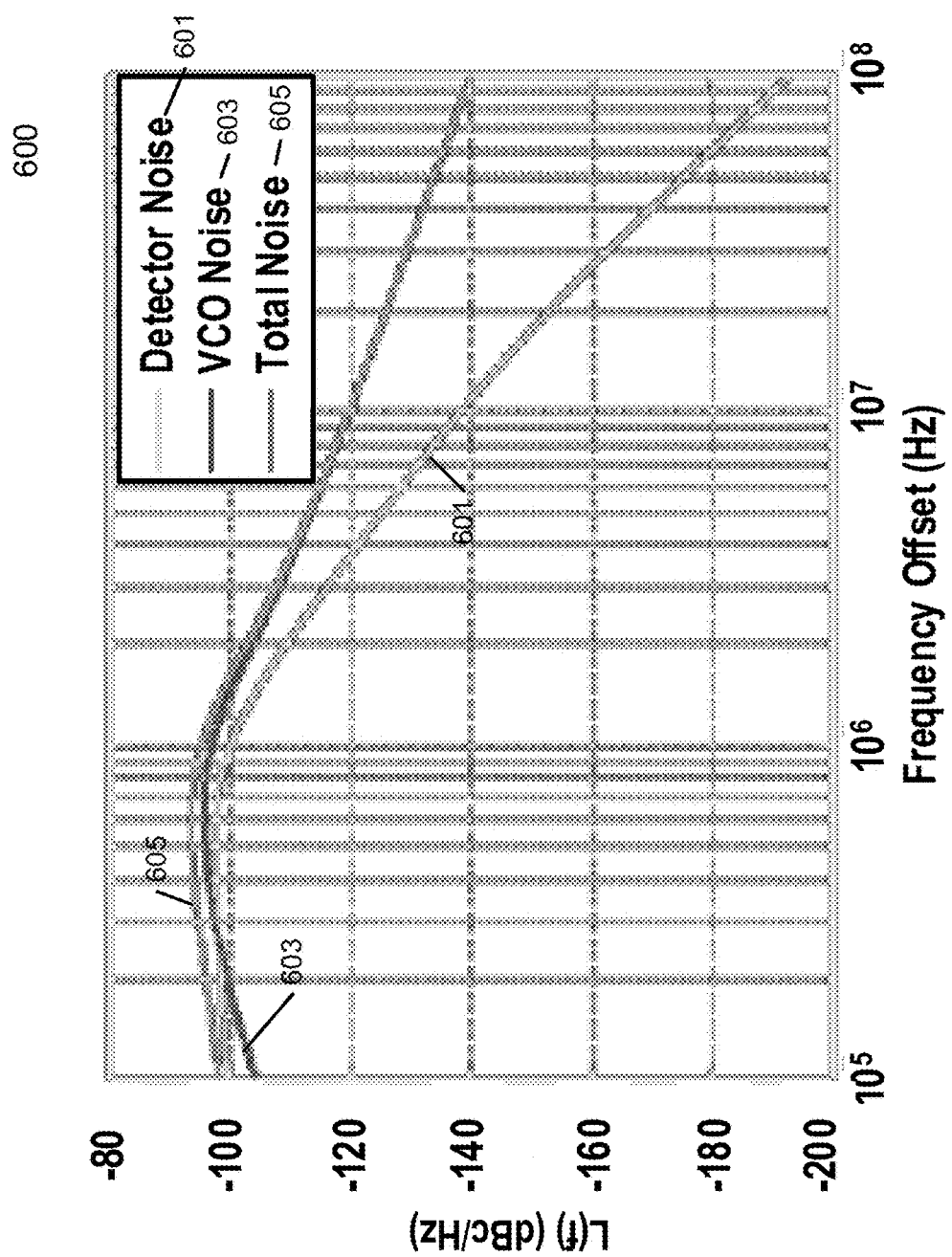
FIG. 6 is a block diagram illustrating an example simulation for phase noise of a dual-band PLL circuit at 36 GHz according to one embodiment.

FIG. 5 is a block diagram illustrating an example simulation for phase noise of a dual-band PLL circuit at 22 GHz according to one embodiment. FIG. 6 is a block diagram illustrating an example simulation for phase noise of a dual-band PLL circuit at 36 GHz according to one embodiment. Referring to FIGS. 5-6, detector, VCO and total PLL phase noises are plotted for VCO1 at 22 GHz and VCO2 at 36 GHz respectively. In one embodiment, simulated RMS phase jitter for the 22 GHz and the 36 GHz output is approximately 287 fs and 175.8 fs respectively.

Figure 7:
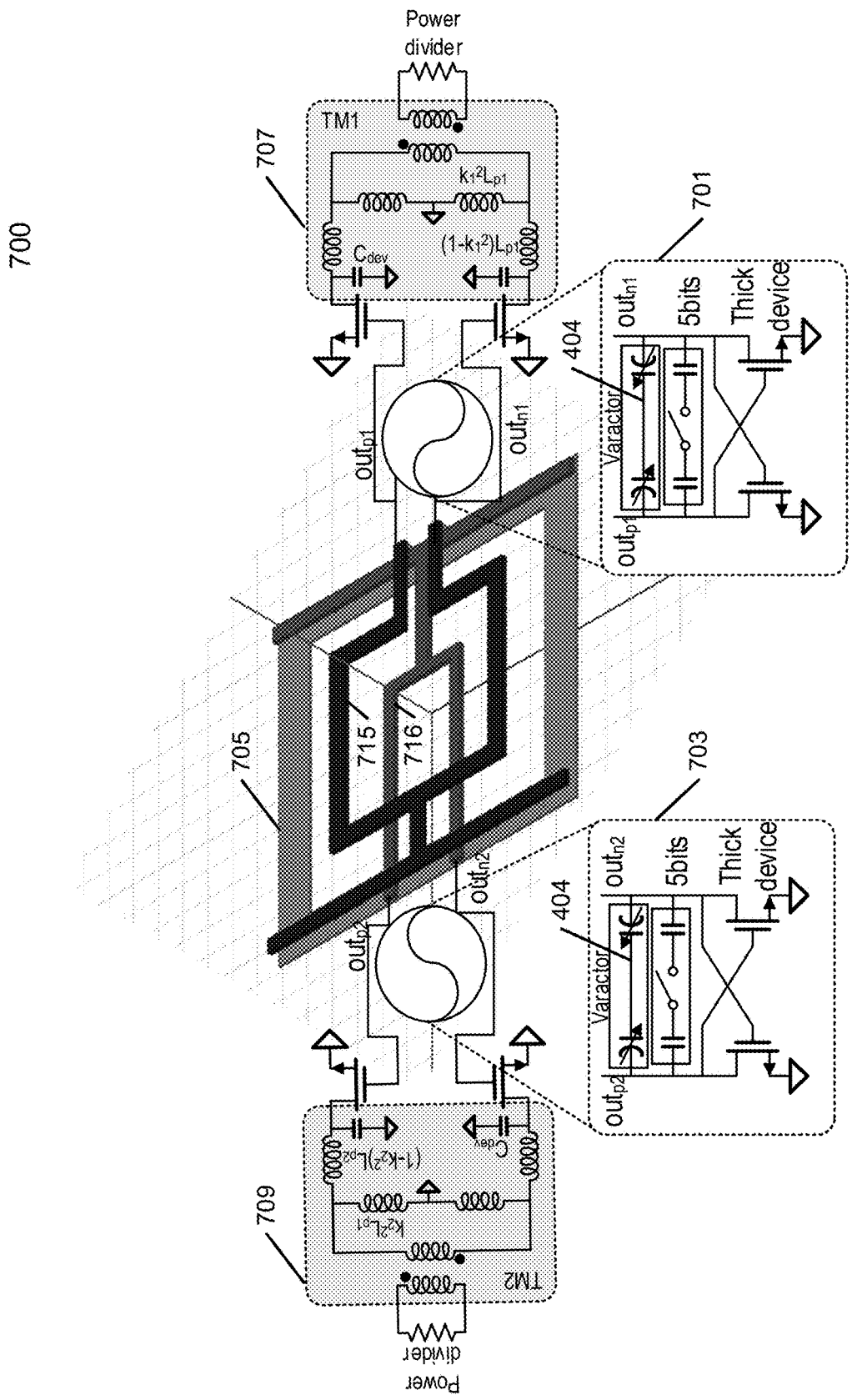
FIG. 7 is a block diagram illustrating an example of a dual voltage controlled oscillator (VCO) circuit according to one embodiment.

FIG. 7 is a block diagram illustrating an example of a dual voltage controlled oscillator (VCO) circuit according to one embodiment. Referring to FIG. 7, dual VCO circuit 700 can be a dual VCO circuit for VCO 405 and VCO 407 of PLL circuit 311 of FIG. 4. In one embodiment, dual VCO circuit 700 includes VCOs 701-703, dual inductor circuit 705 which is shared by VCOs 701-703 resonate with capacitances of VCOs 701-703 at two separate frequencies. VCO circuit 700 also includes output buffer networks 705-707 for VCOs 701-703 respectively to deliver LO signals to mixers of RF transceivers.

Referring to FIG. 7, in one embodiment, VCO 701 can generate a LO signal at a first frequency (e.g., approximately 22 GHz) which is in a first frequency band (e.g., 18.5 GHz-26.5 GHz). VCO 701 includes a first variable capacitor (e.g., varactor or variable capacitor) having an input (node 404), a first output node (outp1), and a second output node (outn1). VCO 701 includes a second variable capacitor (e.g., 5-bit variable capacitance in discrete steps) coupled in parallel with the first variable capacitor. VCO 701 includes a first transistor having a first drain terminal, a first gate terminal, and a first source terminal, where the first drain terminal is coupled to the first (outp1) node, the first gate terminal is coupled to the second (outn1) node, and the first source terminal is coupled to a ground node. VCO 701 includes a second transistor having a second drain terminal, a second gate terminal, and a second source terminal, where the second drain terminal is coupled to the (outn1) second output node and the second gate terminal is coupled to the first (outp1) node, and the second source terminal is coupled to the ground node.

In one embodiment, VCO 702 can generate a LO signal at a second frequency (e.g., approximately 36 GHz) which is in a first frequency band (e.g., 31.5 GHz-41.5 GHz). VCO 702 includes a third variable capacitor (e.g., varactor or variable capacitor) having an input (node 404), a third output node (outp2), and a fourth output node (outn2). VCO 702 includes a fourth variable capacitor (e.g., 5-bit variable capacitance in discrete steps) coupled in parallel with the third variable capacitor. VCO 702 includes a third transistor having a third drain terminal, a third gate terminal, and a third source terminal, where the third drain terminal is coupled to the third (outp2) node, the third gate terminal is coupled to the fourth (outn2) node, and the third source terminal is coupled to the ground node. VCO 702 includes a fourth transistor having a fourth drain terminal, a fourth gate terminal, and a fourth source terminal, where the fourth drain terminal is coupled to the fourth output node (outn2) and the fourth gate terminal is coupled to the third output node (outp2), and the fourth source terminal is coupled to the ground node. In one embodiment, the transistors of VCOs 701-703 include a channel length which is greater than (e.g., thick) channel lengths of transistors for the rest of a PLL circuit (e.g., PLL 311). For example, the first, second, third, and fourth transistors can have a transistor channel length of 102 nm thick versus a 40 nm channel length for the rest of the transistors of the PLL circuit.

In one embodiment, dual inductor 705 includes two loop inductors (e.g., a first inductor 715 and a second inductor 716) sharing a single inductor footprint. The two inductors can each resonate with a respective capacitance of VCO 701 or VCO 703. In one embodiment, the first and the second inductors are both loop inductors. For example, inductor 715 which corresponds to VCO 701 is coupled between outp1 and outn1 nodes of VCO 701 to resonate with the first and the second variable capacitors of VCO 701. Inductor 716 which corresponds to VCO 703 is coupled between outp2 and outn2 nodes of VCO 703 to resonate with the third and the fourth variable capacitors of VCO 703. In one embodiment, loop inductor 715 has a diameter of approximately 139 μm. In another embodiment, loop inductor 716 has a diameter of approximately 61 μm overlaying loop inductor 715. In another embodiment, inductor 715 and inductor 716 are coupled to a control logic (such as control logic 409 of FIG. 4) for the control logic to enable either VCO 701 or VCO 703.

Referring to FIG. 7, in one embodiment, output buffer network circuits 707-709 are coupled to the output nodes of VCOs 701-703 respectively. Output buffer network circuits 707-709 can drive a respective CML frequency divider for a respective VCO chain or a LO buffer (e.g., LO buffer 312 or LO buffer 315 of FIG. 3) to deliver a LO signal to mixers of RF transceiver circuits.

Figure 8:
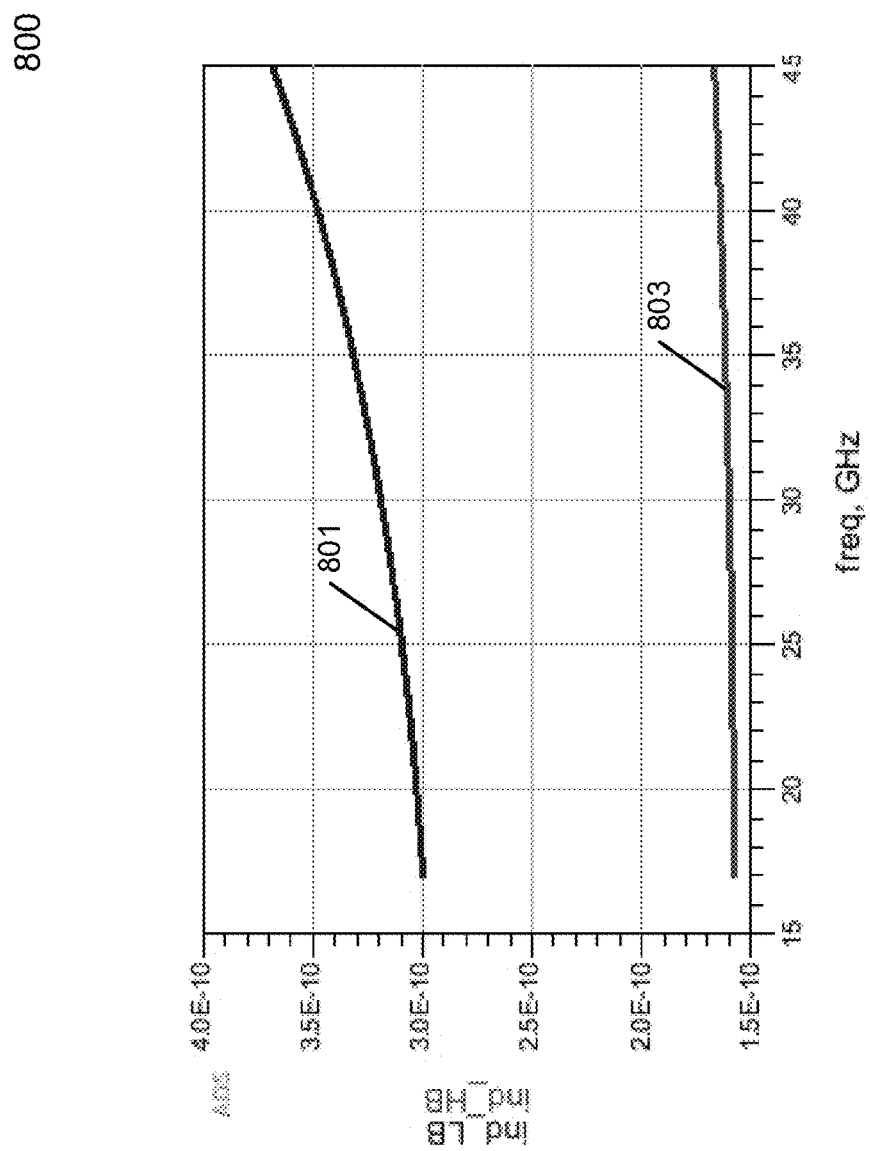
FIG. 8 is an example simulation chart for inductances values for a dual inductance circuit of the dual VCO circuit of FIG. 7.

FIG. 8 is an example simulation chart of inductances values for the dual inductance circuit (e.g., dual inductance 705) of FIG. 7. Referring to FIG. 8, low band (LB) inductance 801 has approximately 3e-10 to 3.1e-10 Henry for the frequency range of 18.5 GHz to 26.5 GHz. High band (HB) inductance 803 has approximately 1.6e-10 Henry for the frequency range of 31.5 to 41.5 GHz.

Figure 9:
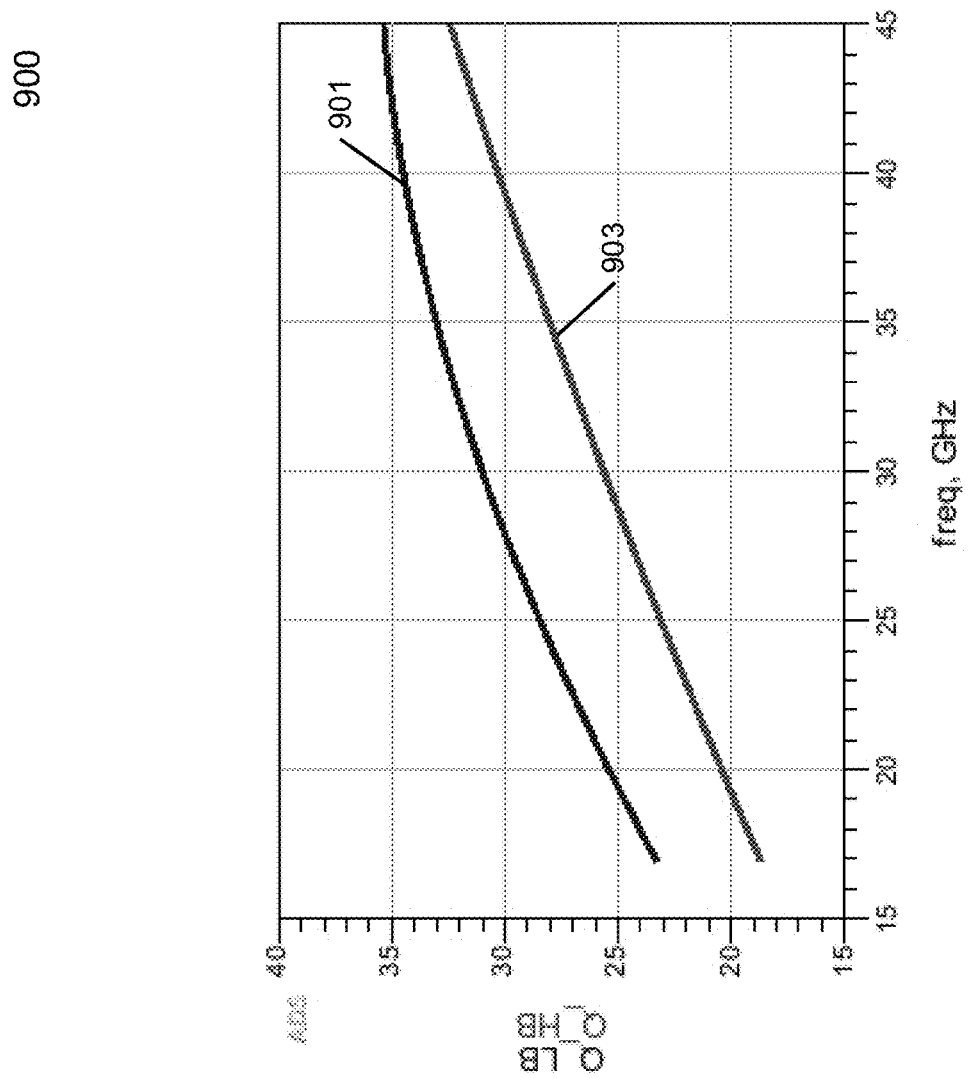
FIG. 9 is an example simulation chart for Q for the dual VCO circuit of FIG. 7.

FIG. 9 is an example simulation chart for Q of the dual VCO circuit of FIG. 7. Referring to FIG. 9, LB Q 901 and HB Q 903 are both >20 for both VCO1 (or LB) and VCO2 (or HB).

Figure 10B:
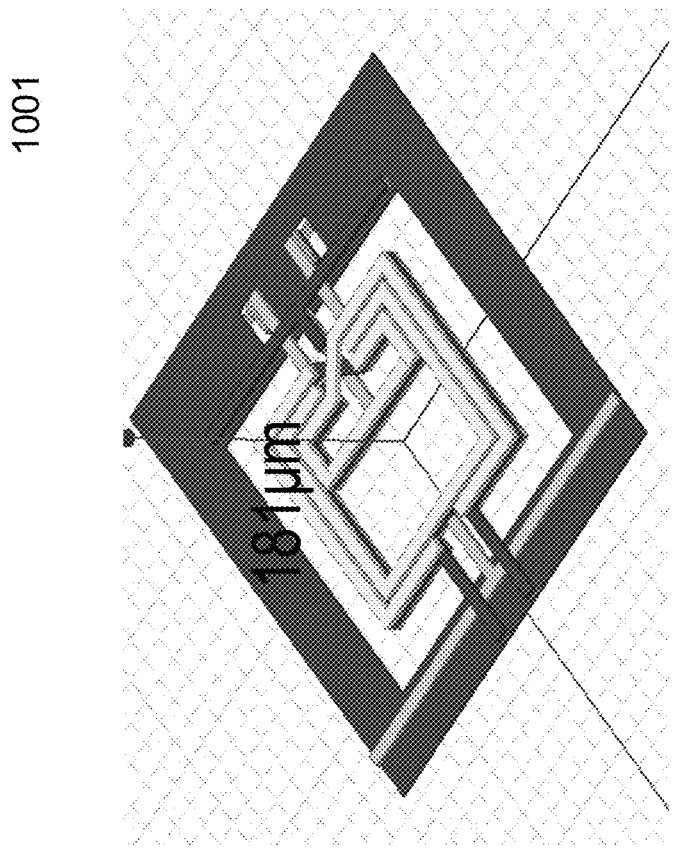
FIG. 10B is a block diagram illustrating a perspective view of a 3D EM model of a transformer circuit for the VCO buffer output network circuit of FIG. 10A.
Figure 10A:
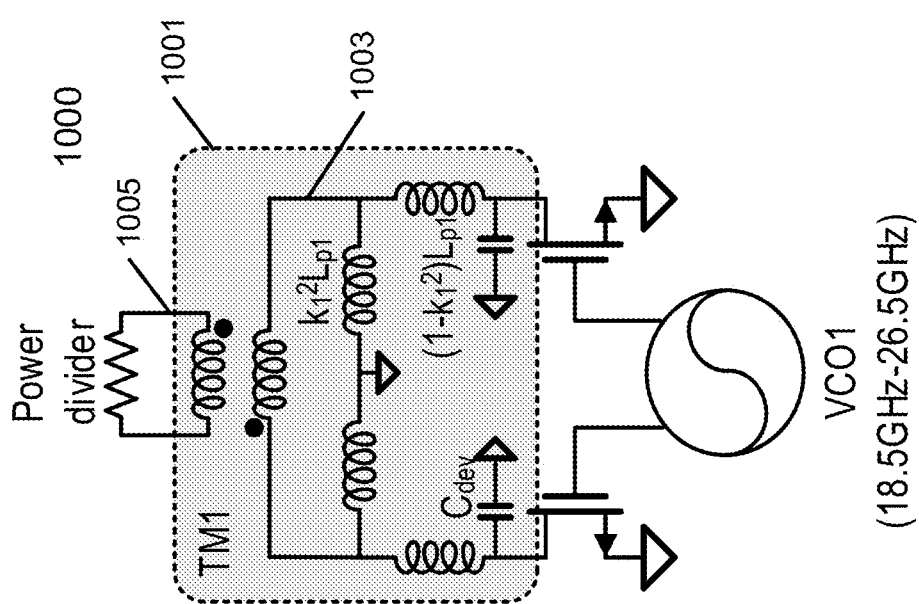
FIG. 10A is a block diagram illustrating an example of a VCO buffer output network circuit for a frequency band of 18.5 GHz to 26.5 GHz according to one embodiment.

FIG. 10A is a block diagram illustrating an example of a VCO buffer output network circuit for a frequency band of 18.5 GHz to 26.5 GHz according to one embodiment. FIG. 10B is a block diagram illustrating a perspective view of a 3D EM model of a transformer circuit for the VCO buffer output network circuit of FIG. 10A. Referring to FIG. 10A, in one embodiment, network 1000 is a second order output network. The second order output network 1000 includes transformer 1001 having a primary winding 1003 and a secondary winding 1005. Secondary winding 1005 is coupled to a power divider (a resistor modeling input impedance of a subsequent stage) which can deliver one or more LO signals to mixers of RF transceivers. In one embodiment, primary winding 1003 is coupled to output ports of a VCO (e.g., VCO 701 of FIG. 7). For example, primary winding 1003 includes a first and a second ends which are coupled respectively to a first and a second drain terminal of a differential amplifier circuit. The gate terminals of the differential amplifier circuit can be coupled to output ports (e.g., outp1 and outn1) of a VCO (e.g., VCO 701 of FIG. 7). Transformer 1001 includes leakage inductance and magnetic inductance, which resonates at two separate frequencies, with a parasitic device capacitance seen by secondary winding 1005 and a coil capacitance of secondary winding 1005. In one embodiment, transformer 1001 has a transformer turn ratio of approximately 1 to 1.5.

Figures 11A, 11B:
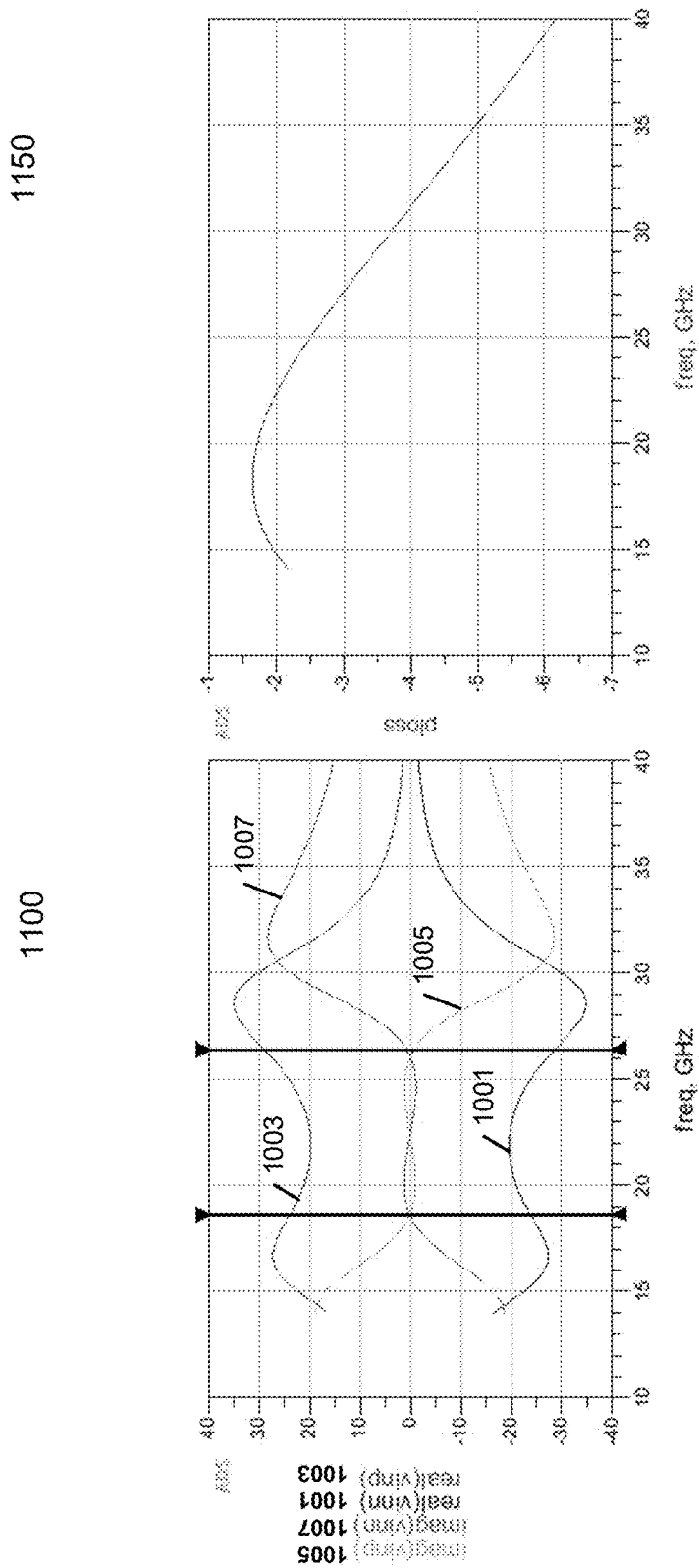
FIG. 11A is an example simulation chart for output impedance values of the VCO buffer output network circuit for the dual VCO circuit of FIG. 10A.
FIG. 11B is an example simulation chart for power loss values for the VCO buffer output network circuit of FIG. 10A.

FIG. 11A is an example simulation chart for output impedance values of the VCO buffer output network circuit for the dual VCO circuit of FIG. 10A. FIG. 11B is an example simulation chart for power loss values for the VCO buffer output network circuit of FIG. 10A. Referring to FIG. 11A, the output impedance of VCO buffer output network circuit 1000 is approximately 25 ohms (approximately all real impedances) for the frequency range of 18.5 GHz to 26.5 GHz. Referring to FIG. 11B, the passive power loss for VCO buffer output network circuit 1000 is <−3 dB for the frequency range of 18.5 GHz to 26.5 GHz.

Figures 12A, 12B:
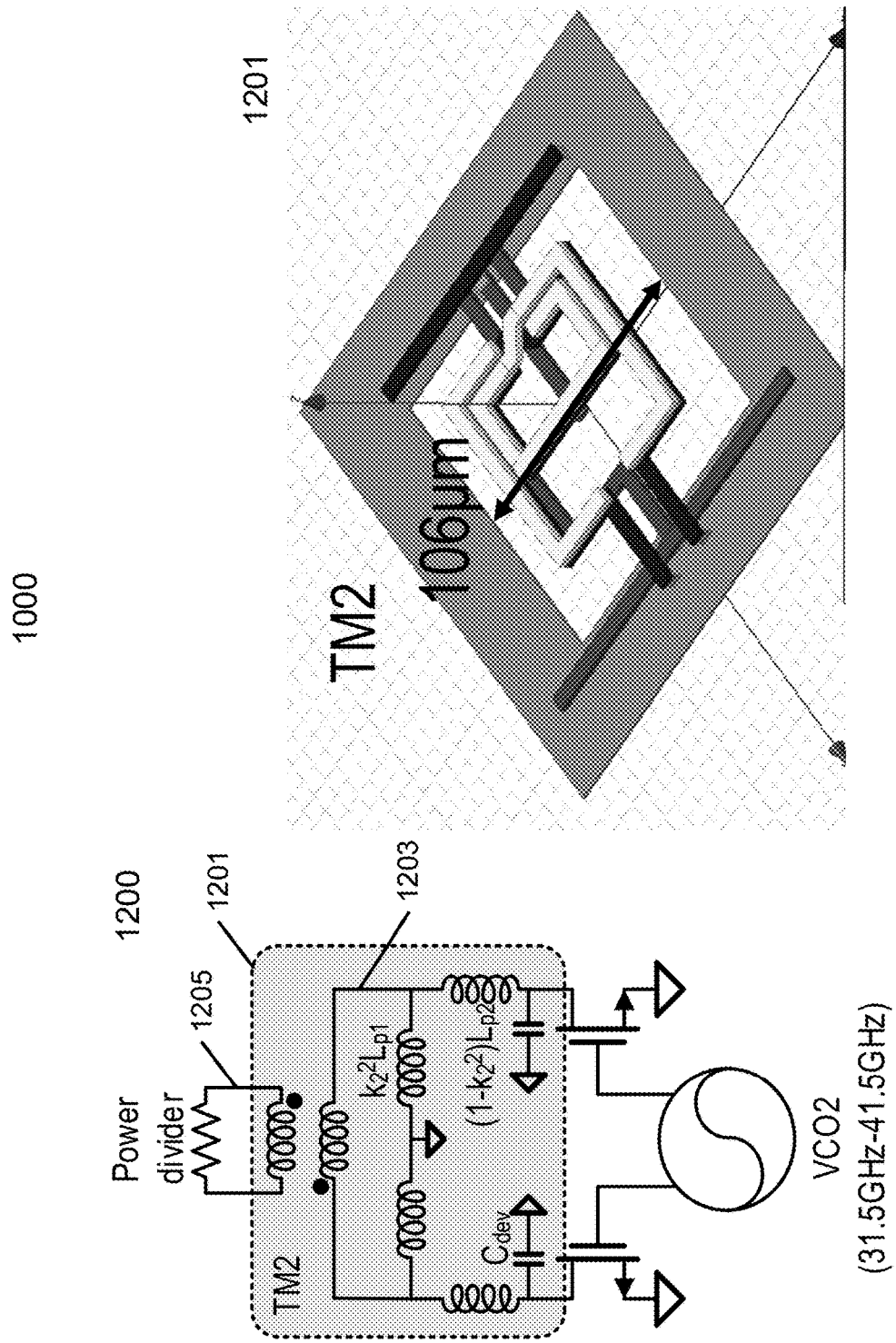
FIG. 12A is a block diagram illustrating an example of a VCO buffer output network circuit for a frequency band of 31.5 GHz to 41.5 GHz according to one embodiment.
FIG. 12B is a block diagram illustrating a perspective view of a 3D EM model of a transformer circuit for the VCO buffer output network circuit of FIG. 12A.

FIG. 12A is a block diagram illustrating an example of a VCO buffer output network circuit for a frequency band of 31.5 GHz to 41.5 GHz according to one embodiment. FIG. 12B is a block diagram illustrating a perspective view of a 3D EM model of a transformer circuit for the VCO buffer output network circuit of FIG. 12A. Referring to FIG. 12A, buffer output network 1200 is similar in structure to buffer output network 1000 of FIG. 10A. Transformer 1201 has a different dimension, e.g., approximately 106 μm in diameter, in comparison with transformer 1001, which has approximately 181 μm of a diameter. Here, buffer output network 1200 resonates at a different frequency than buffer output network 1000 because transformer 1201 is of a different footprint. For example, transformer 1201 includes a leakage inductance and a magnetic inductance (different from transformer 1001), which resonates at two other separate frequencies, with a parasitic device capacitance seen by secondary winding 1205 and a coil capacitance of secondary winding 1205. The different transformer sizes or footprints cause the buffer output networks to resonate at different frequencies. In one embodiment, similar to transformer 1001, transformer 1201 has a transformer turn ratio of approximately 1 to 1.5.

Figures 13A, 13B:
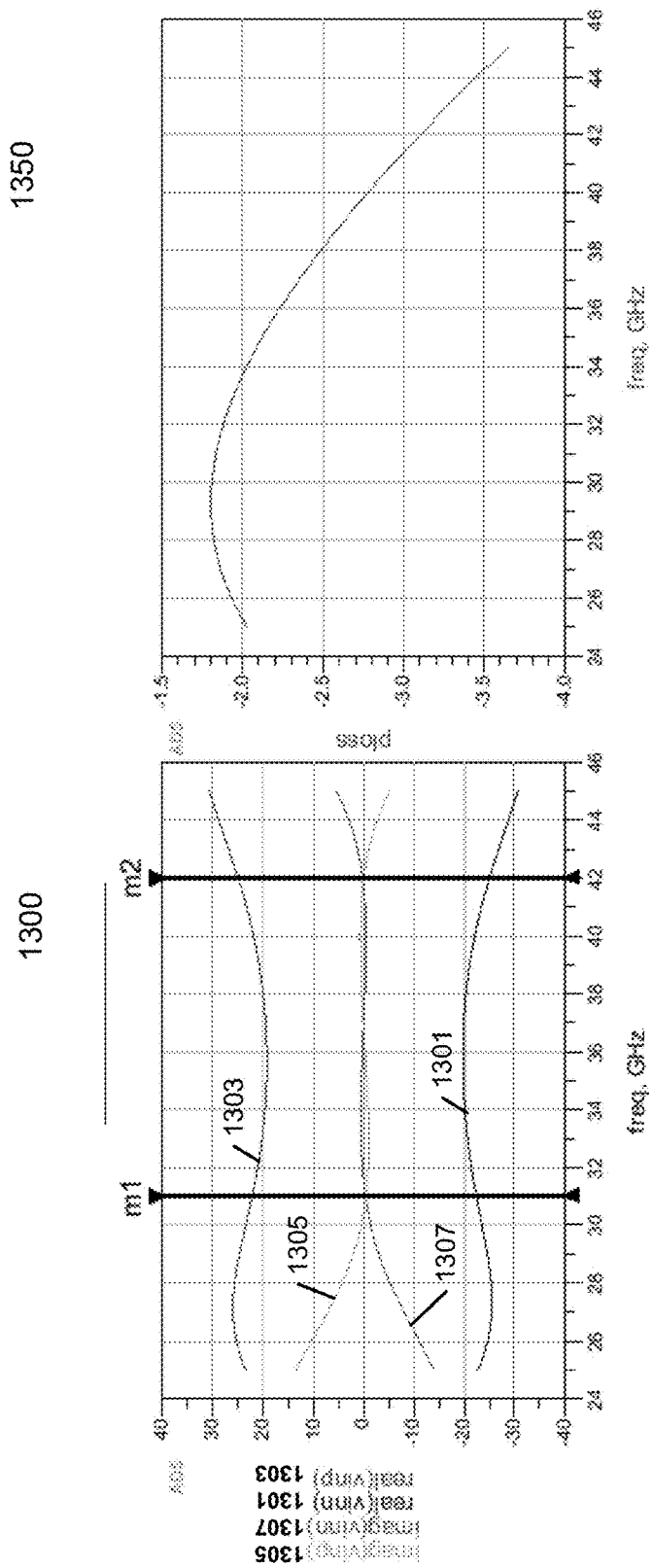
FIG. 13A is an example simulation chart for output impedance values of the VCO buffer output network circuit for the dual VCO circuit of FIG. 12A.
FIG. 13B is an example simulation chart for power loss values for the VCO buffer output network circuit of FIG. 12A.

FIG. 13A is an example simulation chart for output impedance values of the VCO buffer output network circuit for the dual VCO circuit of FIG. 12A. FIG. 13B is an example simulation chart for power loss values for the VCO buffer output network circuit of FIG. 12A. Referring to FIG. 13A, the output impedance of VCO buffer output network circuit 1200 is approximately 25 ohms and are approximately all real impedances for a frequency range of 31.5 GHz to 41.5 GHz. Referring to FIG. 13B, the passive power loss for VCO buffer output network circuit 1200 is <−3 dB for the frequency range of 31.5 GHz to 41.5 GHz.

Figure 14:
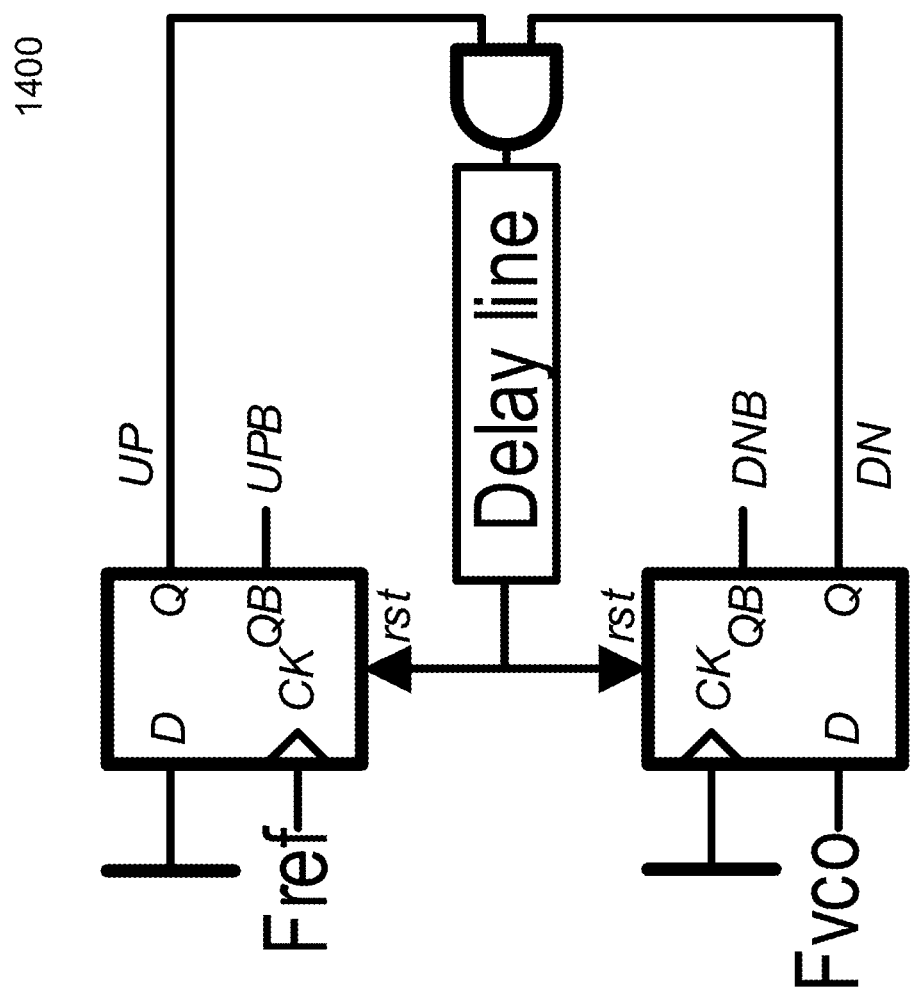
FIG. 14 is a block diagram illustrating an example of a phase frequency detector (PFD) circuit according to one embodiment.

FIG. 14 is a block diagram illustrating an example of a phase frequency detector (PFD) circuit according to one embodiment. PFD 1400 can be the PFD block of FIG. 4. Referring to FIG. 14, in one embodiment, PFD 1400 includes two D flip-flop circuits. The first D flip-flop circuit is coupled to a reference clock signal (e.g., 401 of FIG. 4) at the D input port, a first feedback path (e.g., signal UP) at the Q output port, and signal UPB at the QB output port. The second D flip-flop circuit is coupled to a VCO feedback loop (e.g., feedback loop 413 of FIG. 4) at the D input port, a second feedback path (e.g., signal DN) at the Q output port, and signal DNB at the QB output port. The first and the second feedback paths are coupled to a first and a second input port of an "and gate". The output port of the "and gate" is coupled to a delay line. The delay line is coupled to reset ports of the first and the second D flip-flop circuits to eliminate a dead zone where phase error cannot be detected leading to PLL jitter. The PFD circuit is coupled to a subsequent charge pump circuit.

Figure 15:
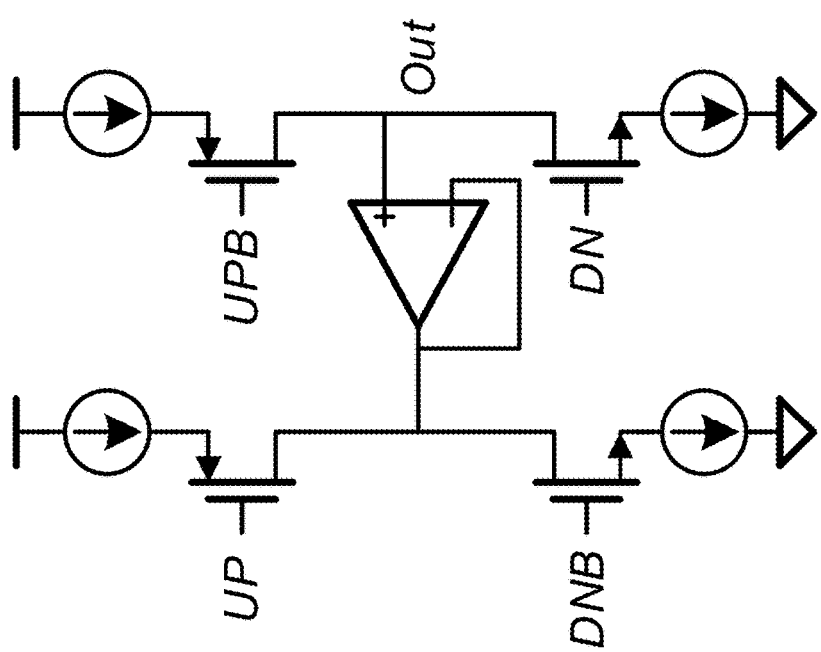
FIG. 15 is a block diagram illustrating an example of a charge pump circuit according to one embodiment.

FIG. 15 is a block diagram illustrating an example of a charge pump circuit according to one embodiment. Charge pump circuit 1500 can be the charge pump or "Icp" block of FIG. 4. A charge pump can be a DC to DC converter that uses capacitors as charge storage to raise or lower an output voltage. Referring to FIG. 15, in one embodiment, charge pump 1500 includes a first pnp transistor having a gate terminal coupled to signal UPB from a PFD (such as PFD 1400 of FIG. 14). The first pnp transistor having a gate terminal coupled to signal DN from the PFD, and a source terminal coupled to a drain terminal of a first npn transistor and an input port of an op-amp having a negative feedback. Charge pump circuit 1500 includes a second pnp transistor having a gate terminal coupled to signal UP from the PFD, and a source terminal coupled to a drain terminal of a second npn transistor and an output port of the op-amp. The second npn transistor includes a gate terminal coupled to signal DNB from the PFD. The charge pump circuit is coupled to a subsequent loop filter (LPF) and the VCO circuits of the PLL circuit. The charge pump can raise or lowers a voltage to control the frequency of oscillation of the VCOs.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A phase locked loop (PLL) circuit, the circuit comprising:
   a first voltage controlled oscillator (VCO) to generate a first signal having a first frequency in a first frequency band;
   a second VCO to generate a second signal having a second frequency in a second frequency band, wherein the second frequency band is a different frequency band than the first frequency band;
   a multiplexer coupled to the first VCO, the second VCO, and a feedback loop;
   a control logic to select either the first VCO or the second VCO using the multiplexer to feed back a signal associated with the first VCO or the second VCO using the feedback loop; and
   a phase frequency detector coupled to the first VCO, the second VCO, and the feedback loop, wherein the phase frequency detector is configured to receive a reference signal and a feedback signal to track a frequency and a phase of the first or the second generated signal using the reference signal and the feedback signal, wherein the first frequency range is approximately 18.5 GHz to 26.5 GHz and the second frequency range is approximately 31.5 GHz to 41.5 GHz.

2. The PLL circuit of claim 1, wherein the phase locked loop circuit generates a first local oscillator (LO) signal having the first frequency or a second LO signal having the second frequency, wherein the first frequency and the second frequency are both first harmonics.

3. The PLL circuit of claim 1, further comprising:
a first current model logic (CML) frequency divider circuit coupled in between the first VCO and the multiplexer; and
a second CML frequency divider circuit coupled in between the second VCO and the multiplexer.

4. The PLL circuit of claim 3, wherein the first or the second CML frequency divider circuit is a $\frac{1}{16}$ frequency divider.

5. The PLL circuit of claim 3, further comprising:
a first digital frequency divider circuit coupled in between the first CML and the multiplexer; and
a second digital frequency divider circuit coupled in between the second CML and the multiplexer.

6. The PLL circuit of claim 1, further comprising a low pass filter coupled in between the phase frequency detector and the first and the second VCOs, wherein the low pass filter is a third order low pass filter.

7. The PLL circuit of claim 6, wherein the third order low pass filter includes a passive resistor-capacitor network having three separate resonant frequencies.

8. The PLL circuit of claim 1, wherein the control logic further disables one of the first VCO or the second VCO that is not selected.

9. A phase locked loop (PLL) circuit, the circuit comprising:
a first voltage controlled oscillator (VCO) to generate a first signal having a first frequency in a first frequency band;
a second VCO to generate a second signal having a second frequency in a second frequency band, wherein the second frequency band is a different frequency band than the first frequency band;
a multiplexer coupled to the first VCO, the second VCO, and a feedback loop;
a control logic to select either the first VCO or the second VCO using the multiplexer to feed back a signal associated with the first VCO or the second VCO using the feedback loop;
a phase frequency detector coupled to the first VCO, the second VCO, and the feedback loop, wherein the phase frequency detector is configured to receive a reference signal and a feedback signal to track a frequency and a phase of the first or the second generated signal using the reference signal and the feedback signal;
a first current model logic (CML) frequency divider circuit coupled in between the first VCO and the multiplexer;
a second CML frequency divider circuit coupled in between the second VCO and the multiplexer;
a first digital frequency divider circuit coupled in between the first CML and the multiplexer; and
a second digital frequency divider circuit coupled in between the second CML and the multiplexer, wherein the first or the second digital frequency divider circuit is selectable from $\frac{1}{16}$ to $\frac{1}{63}$ frequency divisions.

10. A radio frequency (RF) frontend circuit comprising a phase locked loop circuit to generate a local oscillator (LO) signal, the phase locked loop circuit comprising:

a first voltage controlled oscillator (VCO) to generate a first signal having a first frequency in a first frequency band;
a second VCO to generate a second signal having a second frequency in a second frequency band, wherein the second frequency band is a different frequency band than the first frequency band;
a multiplexer coupled to the first VCO, the second VCO, and a feedback loop;
a control logic to select either the first VCO or the second VCO using the multiplexer to feed back a signal associated with the first VCO or the second VCO using the feedback loop; and
a phase frequency detector coupled to the first VCO, the second VCO, and the feedback loop, wherein the phase frequency detector is configured to receive a reference signal and a feedback signal to track a frequency and a phase of the first or the second generated signal using the reference signal and the feedback signal, wherein the first frequency range is approximately 18.5 GHz to 26.5 GHz and the second frequency range is approximately 31.5 GHz to 41.5 GHz.

11. The RF frontend circuit of claim 10, wherein the phase locked loop circuit generates a first LO having the first frequency or a second LO having the second frequency, wherein the first frequency and the second frequency are both first harmonics.

12. The RF frontend circuit of claim 10, wherein the phase locked loop circuit further comprises:
a first current model logic (CML) frequency divider circuit coupled in between the first VCO and the multiplexer; and
a second CML frequency divider circuit coupled in between the second VCO and the multiplexer.

13. The RF frontend circuit of claim 12, wherein the first or the second CML frequency divider circuit is a $\frac{1}{16}$ frequency divider.

14. The RF frontend circuit of claim 12, wherein the phase locked loop circuit further comprises:
a first digital frequency divider circuit coupled in between the first CML and the multiplexer; and
a second digital frequency divider circuit coupled in between the second CML and the multiplexer.

15. The RF frontend circuit of claim 10, wherein the phase locked loop circuit further comprises a low pass filter coupled in between the phase frequency detector and the first and the second VCOs, wherein the low pass filter is a third order low pass filter.

16. The RF frontend circuit of claim 15, wherein the third order low pass filter includes a passive resistor-capacitor network having three separate resonant frequencies.

17. The RF frontend circuit of claim 10, wherein the control logic further disables one of the first VCO or the second VCO that is not selected.

18. A radio frequency (RF) frontend circuit comprising a phase locked loop circuit to generate a local oscillator (LO) signal, the phase locked loop circuit comprising:
a first voltage controlled oscillator (VCO) to generate a first signal having a first frequency in a first frequency band;
a second VCO to generate a second signal having a second frequency in a second frequency band, wherein the second frequency band is a different frequency band than the first frequency band;
a multiplexer coupled to the first VCO, the second VCO, and a feedback loop;

a control logic to select either the first VCO or the second VCO using the multiplexer to feed back a signal associated with the first VCO or the second VCO using the feedback loop;

a phase frequency detector coupled to the first VCO, the second VCO, and the feedback loop, wherein the phase frequency detector is configured to receive a reference signal and a feedback signal to track a frequency and a phase of the first or the second generated signal using the reference signal and the feedback signal;

a first current model logic (CML) frequency divider circuit coupled between the first VCO and the multiplexer;

a second CML frequency divider circuit coupled in between the second VCO and the multiplexer;

a first digital frequency divider circuit coupled in between the first CML and the multiplexer; and a second digital frequency divider circuit coupled in between the second CML and the multiplexer, wherein the first or the second digital frequency divider circuit is selectable from $1/16$ to $1/63$ frequency divisions.

* * * * *